United States Patent
Taghizadeh-Kaschani

(10) Patent No.: US 7,221,713 B2
(45) Date of Patent: May 22, 2007

(54) METHOD AND APPARATUS FOR TRANSMITTING A DIGITAL DATA WORD

(75) Inventor: Karim-Thomas Taghizadeh-Kaschani, Poing (DE)

(73) Assignee: Infineon Technologies AG, München (DE)

( * ) Notice: Subject to any disclaimer, the term of this patent is extended or adjusted under 35 U.S.C. 154(b) by 837 days.

(21) Appl. No.: 10/413,813

(22) Filed: Apr. 15, 2003

(65) Prior Publication Data

US 2004/0005008 A1    Jan. 8, 2004

(30) Foreign Application Priority Data

Apr. 15, 2002  (DE) .............................. 102 16 605

(51) Int. Cl.
*H04L 27/00* (2006.01)
(52) U.S. Cl. .................. 375/259; 341/100; 341/101; 710/71
(58) Field of Classification Search ............... 375/259; 710/71; 343/100, 101
See application file for complete search history.

(56) References Cited

U.S. PATENT DOCUMENTS

| 5,949,826 A | * | 9/1999 | Iiyama et al. ............... 375/279 |
| 5,978,870 A | * | 11/1999 | Warren ........................ 710/71 |
| 6,738,855 B1 | * | 5/2004 | Goldman .................... 710/315 |

* cited by examiner

*Primary Examiner*—Temesghen Ghebretinsae
*Assistant Examiner*—Juan Alberto Torres
(74) *Attorney, Agent, or Firm*—Laurence A. Greenberg; Werner H. Stemer; Ralph E. Locher

(57) ABSTRACT

A method for transmitting a digital data word, and an apparatus for carrying out the method, include the following processing steps: First, the data word is converted into a first serial differential data sequence which contains the information in at least one initialization bit and in the data bits of the data word in time with a clock signal. The data word is also converted into a second serial differential data sequence which contains the information in at least one initialization bit and in the data bits of an inverted data word, obtained by inverting the data word, in time with the clock signal. Next, the first differential data sequence is transmitted via a first data channel, and the second differential data sequence is transmitted via a second data channel.

11 Claims, 8 Drawing Sheets

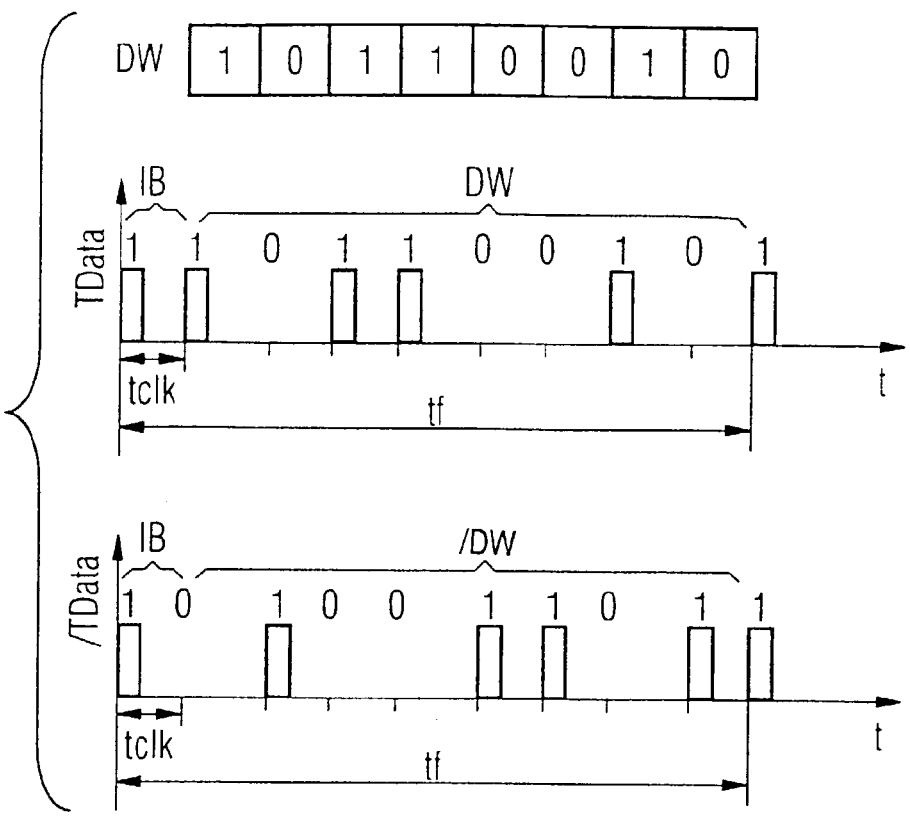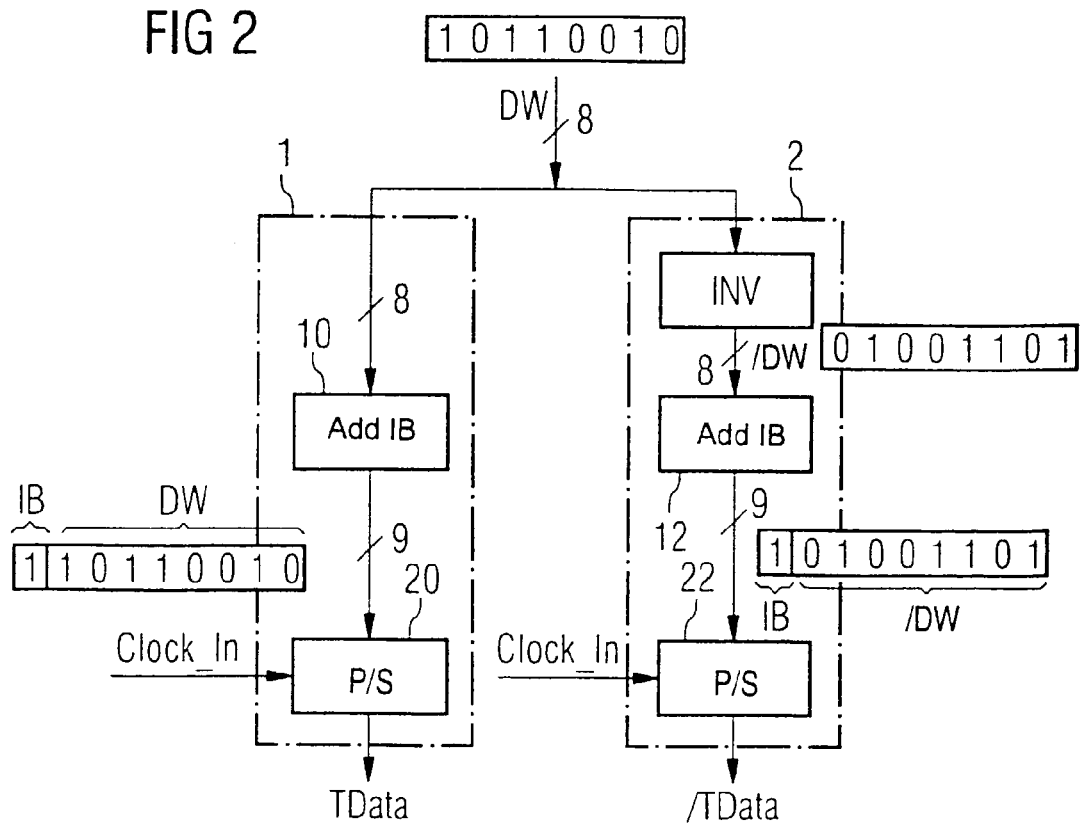

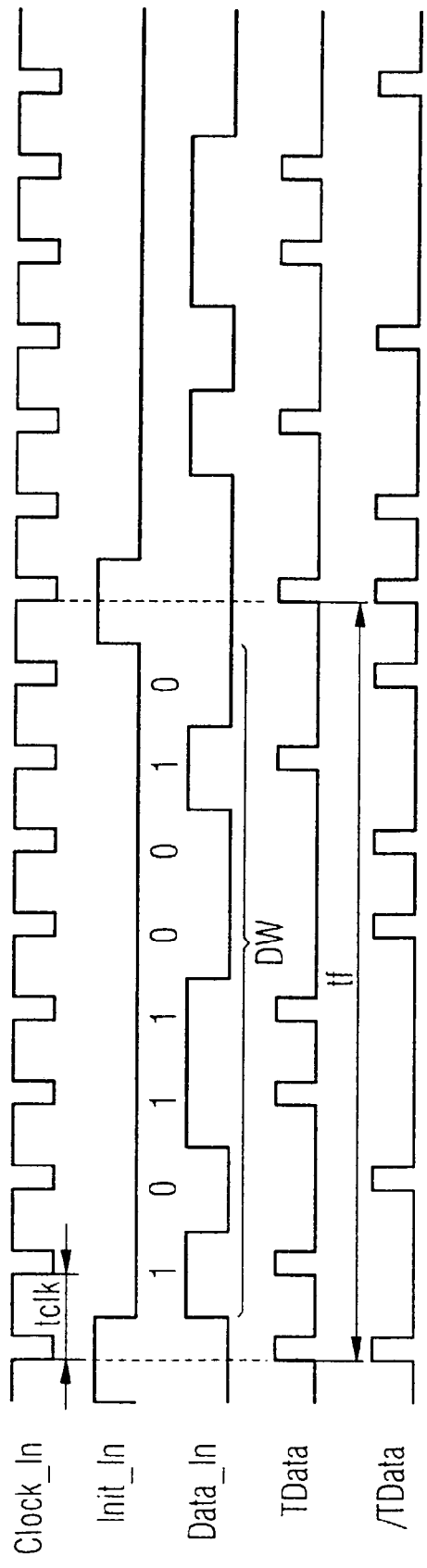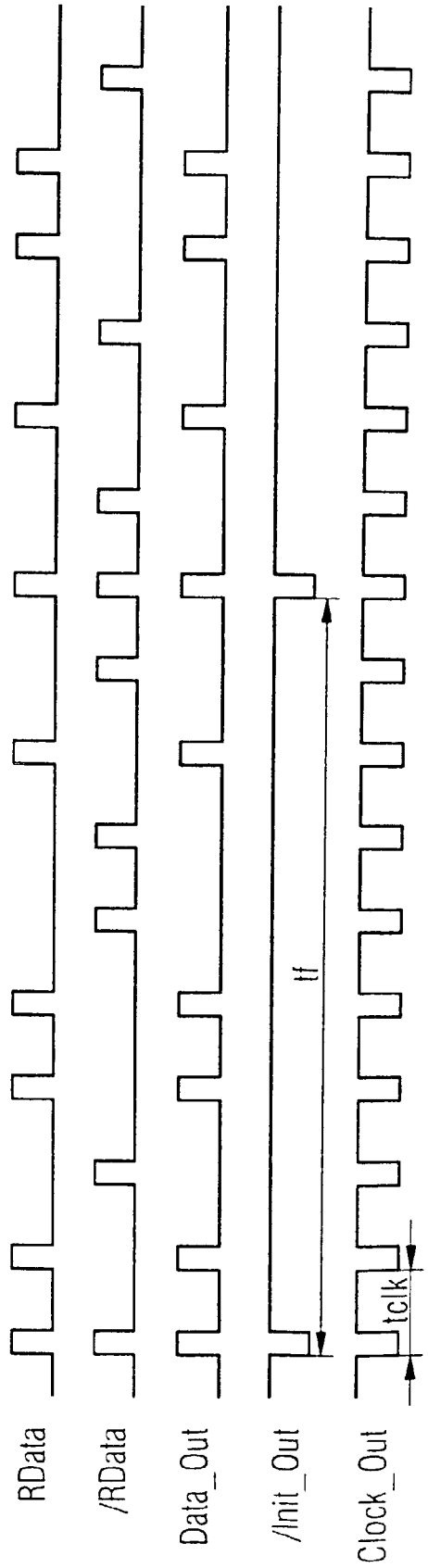

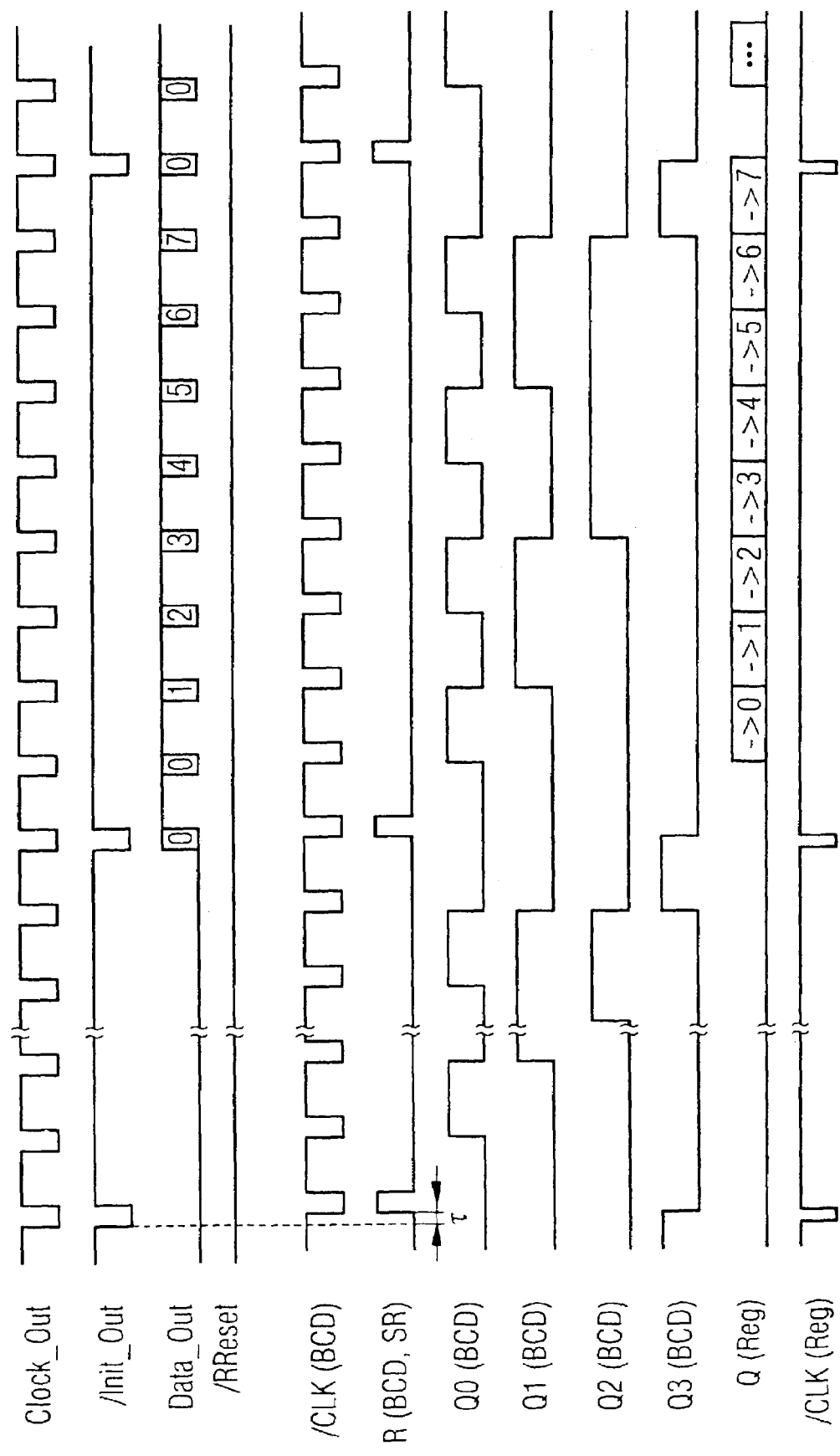

METHOD AND APPARATUS FOR TRANSMITTING A DIGITAL DATA WORD

BACKGROUND OF THE INVENTION

Field of the Invention

The present invention relates to a method and an apparatus for transmitting a digital data word.

In principle, data transmission gives rise to a number of constraints which must be differently weighted depending on the transmission conditions. First, synchronization between transmitter and receiver needs to be ensured, that is to say the start and end of a transmitted data word need to be defined. Depending on the quality of the transmission channel, the data word to be transmitted also needs to have redundancy added in order to allow transmission errors to be identified and ideally also corrected. However, adding such redundancy increases the transmission bandwidth. Furthermore, many applications require the costs of the components needed for data transmission, that is to say transmitter and receiver, to be as low as possible. The same often applies to the power consumption by these components, which needs to be low. Finally, the highest data transmission rate possible needs to be ensured.

SUMMARY OF THE INVENTION

It is accordingly an object of the invention to provide a method and a device for transmitting a digital data word which overcomes the above-mentioned disadvantages of the heretofore-known devices and methods of this general type and which are suitable, in particular, for data transmission via a data transmission link which comprises an inductive coupling element or a transformer.

With the foregoing and other objects in view there is provided, in accordance with the invention, a method for transmitting a digital data word, which comprises the following method steps, to be performed at a transmitter end:
converting the data word into a first serial differential data sequence containing at least one initialization bit and data bits of the data word in time with a clock signal;
converting the data word into a second serial differential data sequence containing at least one initialization bit and data bits of an inverted data word, obtained by inverting the data word, in time with the clock signal;
transmitting the first differential data sequence via a first data channel, and transmitting the second differential data sequence via a second data channel.

The inventive method for transmitting a digital data word of a prescribed length involves transmitter-end generation of a first serial differential data sequence from the data word, the data sequence containing an initialization bit and the data bits of the data word in time with a clock signal, generation of a second serial differential data sequence from the data word, the data sequence containing an initialization bit and the inverted data bits of the data word in time with the clock signal, and transmission of the first differential data sequence via a first channel and transmission of the second differential data sequence via a second data channel.

A differential data sequence, which is also called a return-to-zero data sequence (RTZ sequence), is distinguished in that it assumes the upper signal level, on the basis of the data bit to be transmitted, not for the entire duration of the data bit which is to be transmitted but rather only briefly in each case and then returns to the lower signal level. Such data sequences are particularly suitable for transmission via a channel which contains an inductive coupling element as a transformer.

The initialization bit is preferably chosen such that the first and second data sequences assume the upper signal level during transmission of the initialization bit.

The data sequences received at the receiver end and resulting from the first and second data sequences can easily be used to recover the transmitted data word and the clock signal. The start of a data word is respectively characterized by the initialization bit in the first and second data sequences, with the time of reception of the initialization bit being the time at which the received data symbol in the first data sequence and the received data symbol in the second data sequence have the same value, preferably the upper signal level. In remaining data symbols, the first and second data sequences differ in each case because these data symbols correspond, in the case of the first data sequence, to the data bits of the data word which is to be transmitted, and, in the case of the second data sequence, to the inverted data bits of the data word which is to be transmitted.

The clock signal can easily be recovered by using each data symbol for which the first or second received data sequence has an upper signal level as a clock pulse. The clock signal is necessary in order to recover the transmitted (parallel) data word from the received serial data sequences. By way of example, the clock signal prescribes the timing with which the received serial data symbols enter a serial-parallel converter and controls a counter which governs the sudden output of a number of data symbols forming the data word which have entered the converter.

The inventive method meets fundamental demands on a transmission method using a channel containing a transformer as a coupling element. The method requires just two transformers and can therefore be implemented in a space-saving and inexpensive manner. To identify errors, the data word to be transmitted has redundancy added—for a data word of length n, 2·n+2 data symbols are transmitted. However, this redundancy is low enough to keep down the power consumption of a transmission apparatus implementing the method and of a reception apparatus implementing the method. This purpose is also served by virtue of the inventive method allowing a separate transmission channel for the clock signal to be dispensed with. The use of, preferably, just one initialization bit takes account of the effort to keep down the total transmitted data volume as far as possible.

The method also allows transmission errors to be identified. One error which arises frequently, particularly for transmission links which have an inductive coupling element, is that the received signal has a superposed interference signal which corresponds to a permanently transmitted logic "1" or a permanently transmitted logic "0". A logic "1" permanently applied to both channels is interpreted as an initialization bit and can be identified as an error by comparing the data bits received since the last initialization bit. A permanent logic "0" on both channels can likewise be identified as an error by means of comparison with the data bits received since the last initialization bit.

There are various options for implementing the inventive method.

In accordance with one embodiment of the invention, one or more initialization bit(s) is/are first added to the data word, and the resultant data word is then converted into the first serial differential data sequence. In addition, this embodiment involves the data word being inverted bit by bit and at least one initialization bit likewise being added to the inverted data word, with the resultant data word being converted into the second serial differential data sequence. A converter for converting the data word into the respective data sequence in time with a clock signal can be of any design.

In accordance with another embodiment, a serial data sequence is formed from the data word in time with the clock signal, and an initialization data sequence is additionally formed which has at least one initialization pulse at regular intervals. The serial data sequence comprises information in the data bits of the data word and "wildcards" at the times at which the initialization data sequence contains the at least one initialization pulse. The wildcard can be formed, by way of example, by repeating one or more data bits of the data word. The first and second serial differential data sequences are then formed from the serial data sequence and from the initialization data sequence.

With the above and other objects in view there is also provided, in accordance with the invention, an apparatus for transmitting a data word. The apparatus comprises:

a data input for receiving a data word;

a clock input for receiving a clock signal;

a converter unit for converting the data word into a first serial differential data sequence containing at least one initialization bit and data bits of the data word in time with a clock signal, and into a second serial differential data sequence containing at least one initialization bit and data bits of the data word in inverted form in time with the clock signal;

a first signal output for outputting the first serial data sequence; and a second signal output for outputting the second serial data sequence.

In accordance with an added feature of the invention, the apparatus has a first converter unit for the first data sequence and a second converter unit for the second data sequence. The first converter unit comprising a unit for adding at least one initialization bit to the data word and a parallel-serial converter for converting the data word with the initialization bit into the first data sequence; and the second converter unit comprising an inverter for effecting a bit-by-bit inversion of the data word to form an inverted data word, a unit for adding at least one initialization bit to the inverted data word, and a parallel-serial converter for converting the inverted data word with the initialization bit into the second data sequence.

In accordance with an additional feature of the invention, the converter unit comprises:

a parallel-serial converter unit connected to receive the data word and the clock signal, the parallel-serial converter unit converting the data word into a serial data sequence in synchronicity with the clock signal and providing a serial initialization data sequence containing the at least one initialization bit; and a coder connected downstream of the parallel-serial converter unit in a signal flow direction, the coder generating the first and second data sequences from the serial data sequence and from the initialization data sequence.

With the above and other objects in view there is also provided, in accordance with the invention, an apparatus for acquiring a data word from a received first serial differential data sequence containing information in at least one initialization bit and in data bits of the data word in time with a clock signal and from a received second serial differential data sequence containing information in at least one initialization bit and in data bits of an inverted data word, obtained by inverting the data word, in time with the clock signal. The apparatus further includes:

a decoder connected to receive the first serial data sequence and the second serial data sequence, the decoder providing a clock signal, a serial output data sequence, and an initialization data sequence; and a serial-parallel converter connected to receive the clock signal, the serial output data sequence and the initialization data sequence, the serial-parallel converter providing an output data word.

In accordance with a further feature of the invention, the decoder is configured to form the serial data sequence from the first received serial data sequence and to form the initialization data sequence and the clock signal from the first received serial data sequence and from the second received serial data sequence.

In accordance with a concomitant feature of the invention, the decoder forms the initialization data sequence using a NAND function and it forms the clock signal using a NOR function from the first received serial data sequence and from the second received serial data sequence.

Other features which are considered as characteristic for the invention are set forth in the appended claims.

Although the invention is illustrated and described herein as embodied in a method and apparatus for transmitting a digital data word, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 1 is a schematic illustration of a data word and of a first and a second serial differential data sequence resulting from the data word;

FIG. 2 is a schematic diagram of an apparatus for converting the data word into the first and second data sequences in line with a first embodiment;

FIG. 4 is a graph with time profiles for selected signals which arise at the transmitter end;

FIG. 5 is a graph with time profiles for selected signals which arise at the receiver end;

FIG. 10 is a graph with time profiles for selected signals from the serial-parallel converter.

DESCRIPTION OF THE PREFERRED EMBODIMENTS

Figure 3:
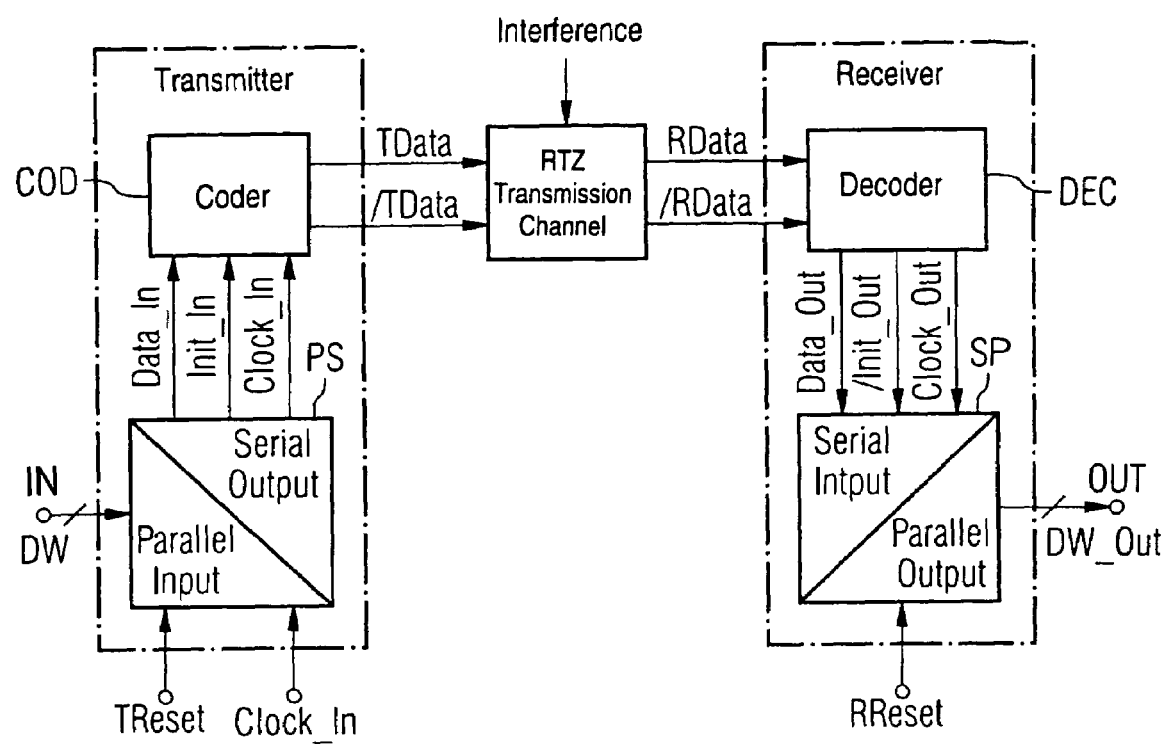
FIG. 3 is a schematic illustration of a transmission system with a transmitter containing a parallel-serial converter and a coder, with a channel and with a receiver containing a decoder and a serial-parallel converter.

Referring now to the figures of the drawing in detail and first, particularly, to FIG. 1 thereof, there is illustrated the novel method for transmitting a data word DW. In the exemplary embodiment, the data word DW is a data word having a length of eight bits. The data word is converted into a first serial differential data sequence TData containing differential data symbols in time with a clock signal Clock_In, these data symbols representing an initialization bit and the data bits of the data word DW, and the initialization bit being preceded by the respective data bits. The interval between two successive data symbols in the first data sequence TData is tclk and corresponds to the clock period of the clock signal Clock_In. The first data sequence TData is a differential data sequence or an RTZ (Return-To-Zero) data sequence, that is to say the value of the respective data symbol is assumed not for the entire clock period tclk but rather, in the exemplary embodiment, only at the start of the clock period tclk in each case.

In the exemplary embodiment shown, a time period tf which is needed to transmit the data word DW is 9·tclk, since an initialization bit IB is transmitted in addition to the eight data bits in the example. The values of the initialization bit IB, which corresponds to a logic "1" in the example, and the values of the data bits are shown above the data symbols in the first data sequence TData.

The data word DW is also converted into a second serial differential data sequence /TData, which is likewise shown in FIG. 1. The second data sequence comprises the initialization bit IB and data symbols which represent the inverted data bits of the data word DW. The data symbols in the second data sequence /TData are likewise available in time with the clock signal Clock_In, with the interval between two successive data symbols, or the clock period, being tclk.

The inventive data transmission method, which involves the data word being converted into a first serial differential data sequence TData and a second serial differential data sequence /TData with the addition of at least one initialization bit, is particularly suitable for transmission via a channel which contains a transformer, where the first data sequence TData is transmitted via a first data channel and the second data sequence /TData is transmitted via a second data channel and where both channels can contain a transformer or an inductive coupling element.

FIG. 2 illustrates a first exemplary embodiment of an apparatus which is suitable for converting the data word DW into the first data sequence TData and the second data sequence /TData. The apparatus comprises a first converter unit 1, which is supplied with the data word DW and provides the first data sequence TData. The apparatus also comprises a second converter unit 2, which is likewise supplied with the data word DW and which provides the second data sequence /TData.

The first converter unit 1 contains a unit 10 which adds an initialization bit IB to the data word DW and whose output provides a data word which contains the initialization bit IB and the data bits of the data word DW. This data word, having one bit more than the original data word DW, is supplied to a parallel-serial converter 20 which provides the first data sequence TData in time with a clock signal Clock_In which is likewise supplied to the converter 20, the converter 20 being configured to form a differential data sequence.

The second converter unit 2 comprises an inverter INV whose output provides a data word /DW which corresponds to the data word DW inverted bit by bit. This inverted data word /DW is supplied to a unit 12 which adds an initialization bit IB to the inverted data word /DW and whose output provides a data word which contains the original initialization bit IB and the data bits of the inverted data word /DW. This data word formed in the unit is supplied to a parallel-serial converter 22 which forms the second serial differential data sequence /TData from the data word with the initialization bit IB and the data bits of the inverted data word /DW.

FIG. 3 schematically shows a complete transmission system with a transmitter, to which the data word DW is supplied and which provides the first and second serial differential data sequences TData, /TData, and with a transmission channel whose output provides a received data sequence RData resulting from the first data sequence TData and a second received data sequence /RData received from the second data sequence /TData. In addition, the transmission system comprises a receiver to which the first received data sequence RData and the second received data sequence /RData are supplied and which provides an output data word DW_Out which corresponds to the transmitter-end data word DW if the data transmitted via the channel are not corrupted.

The transmission channel shown in FIG. 3 preferably comprises a first inductive coupling element, or a first transformer, which is used to transmit the first data sequence TData, and a second inductive coupling element, or a second transformer, which is used to transmit the second data sequence /TData.

At the transmitter end, the transmission system shown in FIG. 3 has a different procedure chosen for generating the first data sequence TData and the second data sequence /TData than the apparatus shown in FIG. 2, as explained below.

The transmitter comprises a parallel-serial converter PS to which the data word DW and successive data words DW are supplied in parallel at an input IN and which provides a serial data sequence Data_In and an initialization sequence Init_In at a first output. The serial data sequence Data_In, the initialization data sequence Init_In and the clock signal Clock_In are supplied to a coder COD which provides the first data sequence TData and the second data sequence /TData from these input signals. Time profiles for the clock signal Clock_In, for the initialization signal Init_In, for the data signal Data_In and for the resultant first and second data sequences TData and /TData are shown in FIG. 4 by way of example.

In the example, the clock signal is in a form such that it predominantly assumes a logic High level and cyclically falls briefly to a Low level. The clock period is tclk. The initialization data sequence Init_In cyclically—in the example shown in FIG. 4, for a clock period tclk in each case—assumes the value of a logic "1". The period duration of the initialization signal Init_In is tf, and thus corresponds to the length of time required to transmit a data word including initialization bits within the first and second data sequences TData, /TData. The time interval between two pulses of the initialization signal Init_In is chosen such that the data bits of the data word DW can be transmitted within this interval.

The data sequence Data_In formed from the data word contains the individual data bits of the data word DW in time with the clock signal, the value of the data symbol resulting from a data bit being retained for one clock period in each case. The data signal Data_In is thus an NRTZ (Non-Return-To-Zero) signal. Besides the data bits of the data word DW, the data signal Data_In contains, before or after the data bits of each data word DW, a wildcard for the respective duration of a clock period, this wildcard allowing insertion of the initialization pulse.

The first serial differential data signal TData, formed from the initialization signal Init_In and from the data signal Data_In, contains a data symbol representing a logic 1 in time with the clock signal Clock_In if the initialization signal corresponds to a logic 1 at the respective clock time or if the data signal corresponds to a logic 1 at the respective clock time. In the example, the duration of the data symbols in the data signal TData respectively corresponds to the length of time for which the clock signal assumes the value of a logic "0", and is shorter than the period duration tclk of the clock signal Clock_In.

The second data sequence /TData contains a data symbol corresponding to a logic 1 at the times at which the initialization signal Init_In contains a logic 1 or at the times at which the data signal Data_In contains a logic "0".

Figure 6:
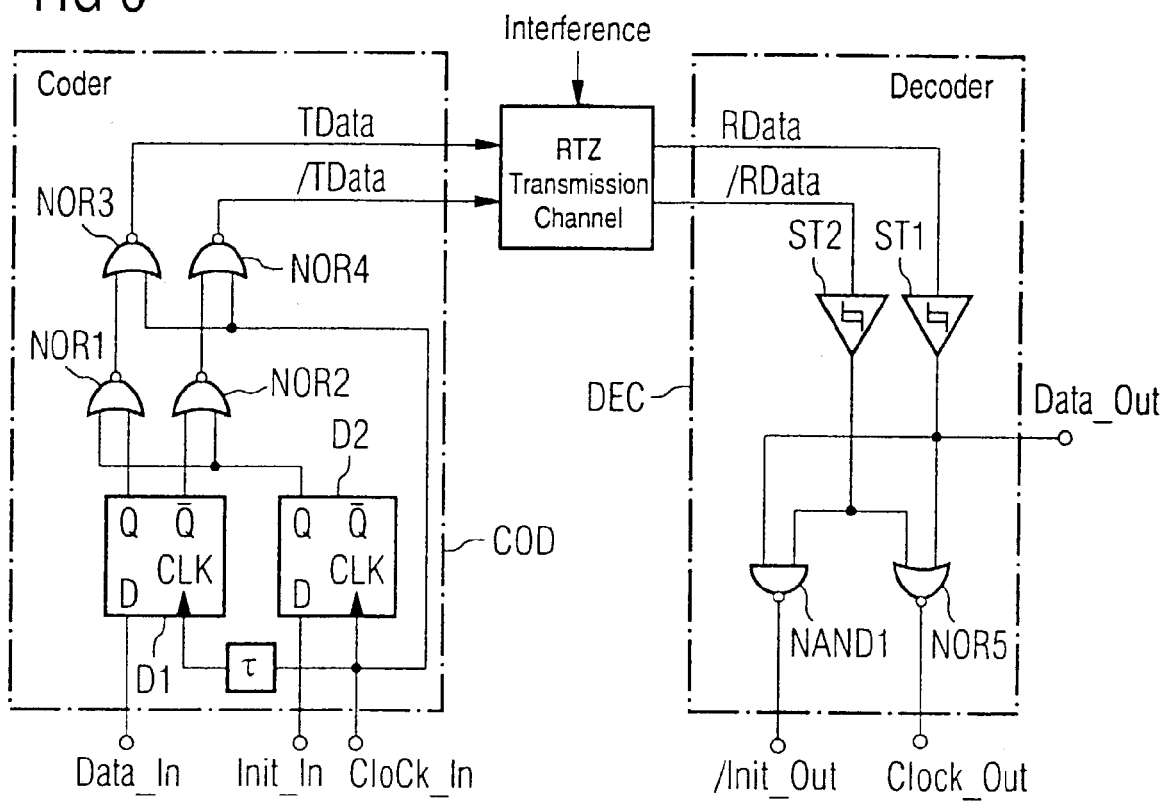
FIG. 6 is a schematic partial illustration of the transmission system with a transmitter-end coder and a receiver-end decoder.

FIG. 6 first shows, in the left-hand part of the transmission system shown, an exemplary embodiment for a coder COD which is suitable for converting the data sequence Data_In shown in FIG. 4, the initialization sequence Init_In and the clock signal Clock_In into the first data sequence TData and the second data sequence /TData.

This coder COD comprises a first D-type flip flop D1, whose data input D is supplied with the data sequence Data_In, and a second D-type flip flop D2, whose data input D is supplied with the initialization sequence Init_In. The two flip-flops D1, D2 are clocked by the clock signal Clock_In, which is supplied to the respective clock inputs CLK of the flip-flops D1, D2, said flip-flops D1, D2 being designed to adopt the data applied to their data inputs D on the falling edge of the clock signal Clock_In in each case. To avoid delay-time effects, the clock signal Clock_In is supplied to one of the flip-flops D1 with a slight delay using a delay element.

The coder COD comprises NOR gates NOR1, NOR3 which serve to form the first serial differential data sequence TData. The inputs of the NOR gate NOR1 are connected to the output Q of the first flip-flop D1 and to the output Q of the second flip-flop D2. The output of the NOR gate NOR1 has a signal applied to it which always assumes the value of a logic "0" when one of the two signals Data_In or Init_In assumes the value of a logic "1". The output signal from the NOR gate NOR1 is supplied to an input of the NOR gate NOR3, with the clock signal Clock_In being supplied to a further input of the NOR gate NOR3. The output of the NOR gate NOR3 always provides a signal having a level of logic "1" when the clock signal assumes the value of a logic "0" and when the output signal from the NOR gate NOR1 assumes the value of a logic "0", or when the data signal Data_In or the initialization signal Init_In assumes the value of a logic "1".

In line with the first data signal TData, the second data signal /TData is formed using two NOR gates NOR2, NOR4, with the inputs of the first NOR gate NOR2 being supplied with the inverted output signal from the first flip-flop D1 and with the output signal from the second flip-flop D2. The output of the NOR gate NOR2 is supplied to one input of the NOR gate NOR4, whose other input is supplied with the clock signal Clock_In. The second data sequence /TData always has the value of a logic "1" when the clock signal Clock_In assumes the value of a logic "0" and when the output signal from the NOR gate NOR2 assumes the value of a logic "0", or when the initialization signal Init_In assumes the value of a logic "1" or the data signal Data_In assumes the value of a logic 0.

Figure 7:
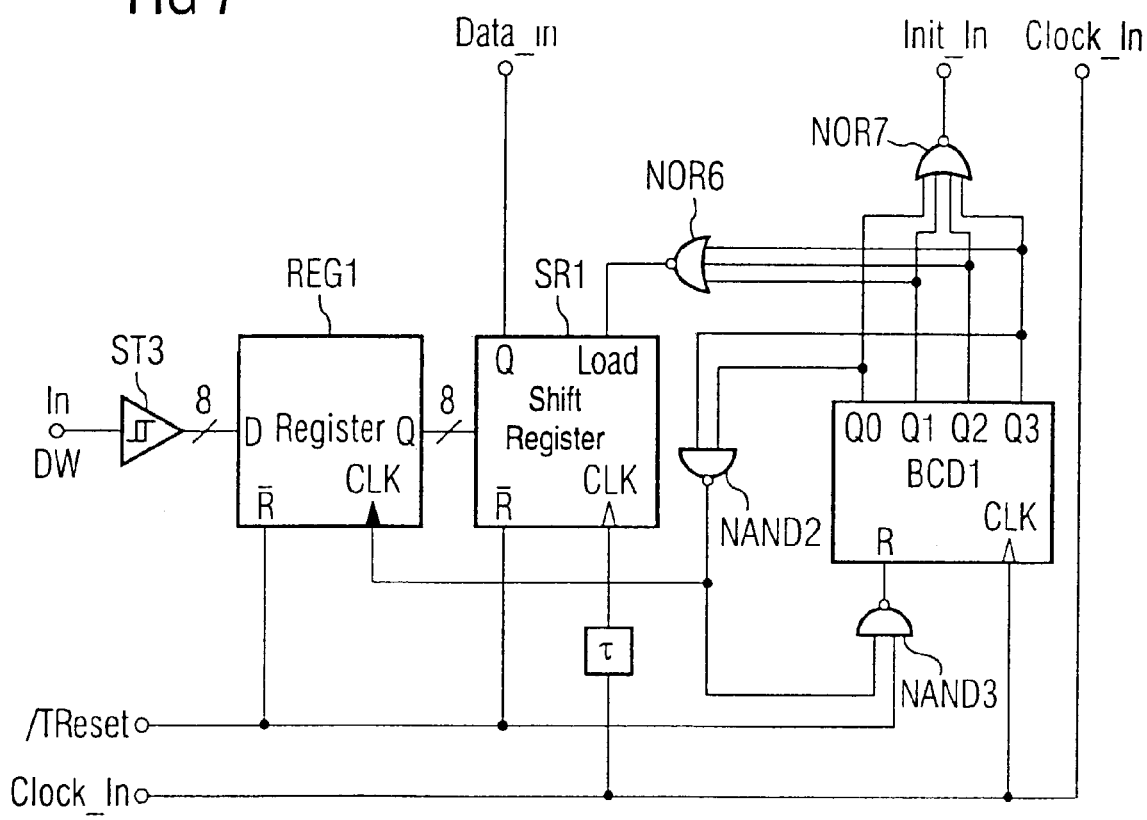
FIG. 7 is a schematic circuit diagram of the transmitter-end parallel-serial converter.

An exemplary embodiment of a parallel-serial converter PS as shown in FIG. 3, which provides the data sequence Data_In and the initialization sequence Init_In from the data word DW and from the clock signal, is shown in FIG. 7. This parallel-serial converter shown is suitable for processing data words having eight bits, with appropriate converters for processing data words having a different number of data bits being able to be derived from the exemplary embodiment shown in FIG. 7 in a manner which is understood by a person skilled in the art.

The parallel-serial converter PS comprises a BCD counter BCD1 whose clock input CLK is supplied with the clock signal Clock_In and which has four outputs Q0, Q1, Q2, Q3, the data bits provided at these outputs representing a number in binary notation, with the output Q0 representing the least significant bit and the output Q3 representing the most significant bit. The count on this counter BCD1 increases by one with every rising edge of the clock signal Clock_In. Connected downstream of the outputs of the BCD counter BCD1 is a NOR gate NOR7 whose inputs are connected to the outputs of the BCD counter BCD1. The output of the NOR gate NOR7 produces the initialization signal Init_In, which assumes the value of a logic "1" only when all the outputs Q0 to Q3 of the BCD counter are at "0", that is to say after the counter BCD1 has been reset.

The counter BCD1 is reset on the basis of the least significant bit Q0 and the most significant bit Q3 and on the basis of an external reset signal /TReset. The least significant bit Q0 and the most significant bit Q3 are supplied to a NAND gate NAND2 whose output is connected to a further NAND gate NAND3, the further input of this NAND gate NAND3 being supplied with the reset signal /TReset. The reset signal /TReset normally has the value of a logic "1" or a High level. The output of the NAND gate NAND2 provides a logic "1" if the least significant bit Q0 and the most significant bit Q3 do not both assume the value of a logic "1". If the most significant bit Q3 and the least significant bit Q0 assume the value of a logic "1", then the output of the NAND gate NAND2 provides a logic "0" and the BCD counter BCD1 is reset via the NAND gate NAND3. Following reset, the counter starts to count from "0" and is reset again as soon as the most significant bit Q3 and the least significant bit Q0 assume the value "1", which corresponds to the decimal value 9. The counter BCD1 is thus always counting from 0 to 9 under the clocking of the clock signal Clock_In.

Figure 8:
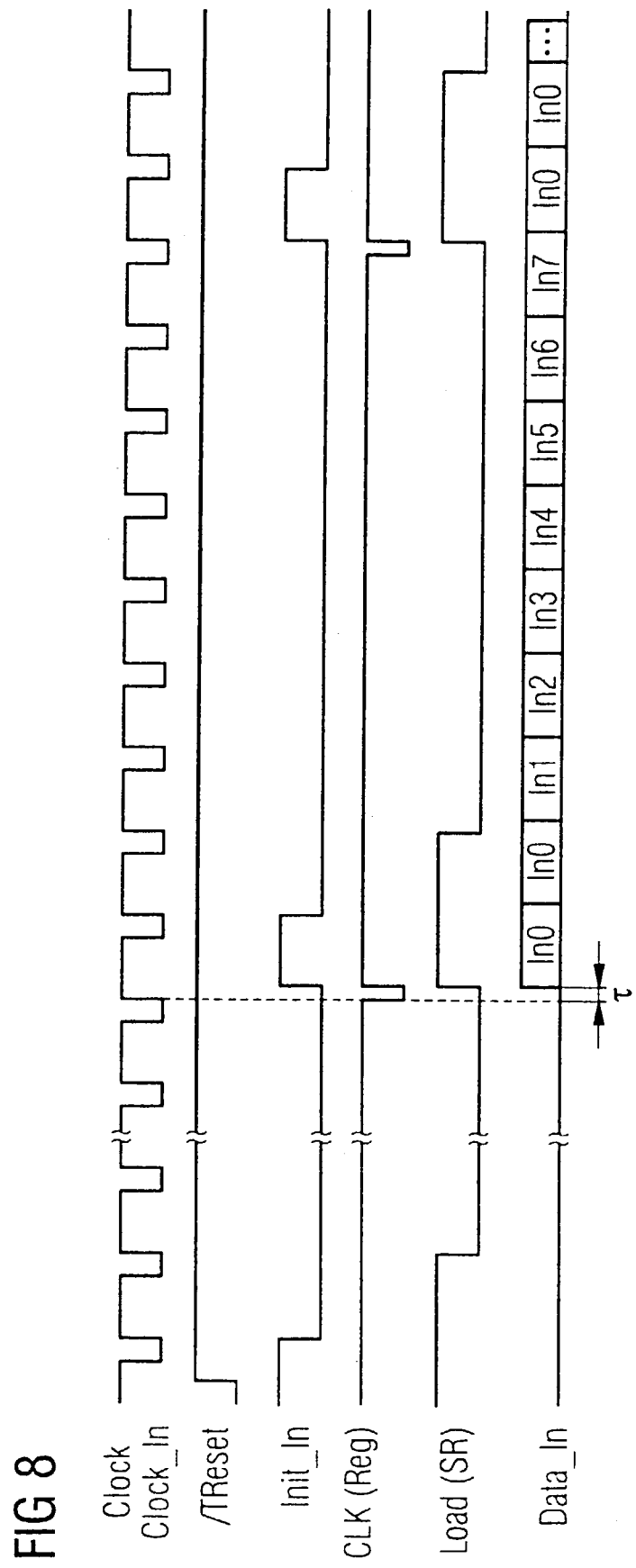
FIG. 8 is a graph with time profiles for selected signals from the parallel-serial converter.

The parallel-serial converter PS also comprises a register REG1 to which the data bits of the data word DW are supplied in parallel via a Schmitt trigger ST3. The register can likewise be reset by means of the external reset signal /TReset, with a reset taking place when the reset signal /TReset assumes the value of a logic "0". The register REG1 is loaded under clock control on the basis of the output signal from the NAND gate NAND2, with the register adopting, upon a falling edge of this signal, the values applied to the data input D and making them available to a downstream shift register SR1 at the data output Q. The register REG1 adopts the data applied to the input respectively when the counter BCD1 has counted to 9. The clock signal CLK(Reg) clocking the register REG1 is shown in FIG. 8. This clock signal assumes—as mentioned—the value of a logic "0" when the BCD counter has counted to 9. Since the counter is then reset, the clock signal CLK(Reg) assumes the value of a logic "1" again just a short time later, with the delay resulting from the gate delay times of the NAND gates NAND2, NAND3 and of the BCD counter BCD1.

The shift register connected downstream of the register REG1 is clocked by the clock signal Clock_In, the shift register respectively outputting one of the stored values as a data symbol in the data sequence Data_In at the output Q upon a rising edge of the clock signal. A delay element connected upstream of the clock input CLK of the shift register SR1 prevents delay-time effects. The data provided by the register REG at the output are adopted by the shift register SR1 on the basis of a load signal applied to a load input Load. This load signal is dependent on the three most significant bits Q1, Q2, Q3 of the BCD counter, which form the three inputs into a NOR gate NOR6, and assumes the value of a logic "1", in order to transfer data to the shift register SR1, only if these three most significant bits are "0". Data are thus loaded into the shift register SR1 after the counter has been reset and once again during the next clock period after the counter has counted to "1", when the least significant bit Q0 is "1". As a result, the data word provided by the register REG1 is loaded into the shift register SR1 twice in succession, and hence one data bit, in the example the data bit In0, is output in the data sequence Data_In twice in succession, as shown in FIG. 8. The data sequence generated from a data word DW having a length of eight bits thus comprises new data symbols, with one of the data bits of the data word being output twice in succession so as to provide a wildcard for the initialization bit in the first or second data sequence produced in the coder.

The right-hand part of FIG. 3 also shows a receiver for converting a first received data sequence RData and a second received data sequence /RData into a data word DW_Out corresponding to the transmitter-end data word DW when the channel is ideally free of interference.

In the exemplary embodiment shown in FIG. 3, the receiver comprises a decoder DEC which provides an output data sequence Data_Out, an output initialization sequence Init_Out and an output clock Clock_Out from the first and second received data sequences RData, /RData, these provided signals being supplied to a serial-parallel converter SP which provides the data word DW_Out therefrom.

The basic way in which the decoder works becomes clear from the profiles shown by way of example in FIG. 5 for received first and second data signals RData,/RData, for the generated output data sequence Data_Out, for the generated initialization data sequence /Init_Out and for the generated clock signal Clock_Out. In the example shown in FIG. 5, it is assumed that transmission via the channel takes place without interference, which means that the first received data signal RData corresponds to the first data signal TData, and the second received data signal /RData corresponds to the second data signal /TData.

The output data signal Data_Out corresponds to the received data signal RData, and the initialization data sequence /Init_Out predominantly has the level of a logic "1" and assumes the level of a logic "0" only when both the first received data signal RData and the second received data signal /RData have a level of "1". The clock signal Clock_Out always assumes the level of a logic "0" when either the first received data signal RData or the second received data signal /RData assume the level of a logic "1".

The right-hand part of FIG. 6 shows an exemplary embodiment of a decoder performing the cited function. This decoder contains first and second Schmitt triggers ST1, ST2 which respectively make a threshold-value decision, the first Schmitt trigger ST1 being supplied with the first received data signal RData and the second Schmitt trigger ST2 being supplied with the second received data signal /RData. The output of the first Schmitt trigger ST1 produces the output data sequence Data_Out. In addition, the output signals from the two Schmitt triggers ST1, ST2 are supplied to a NOR gate NOR5 whose output produces the clock signal Clock_Out, and the output signals from the two Schmitt triggers ST1, ST2 are supplied to a NAND gate NAND1 whose output produces the initialization signal /Init_Out.

Figure 9:
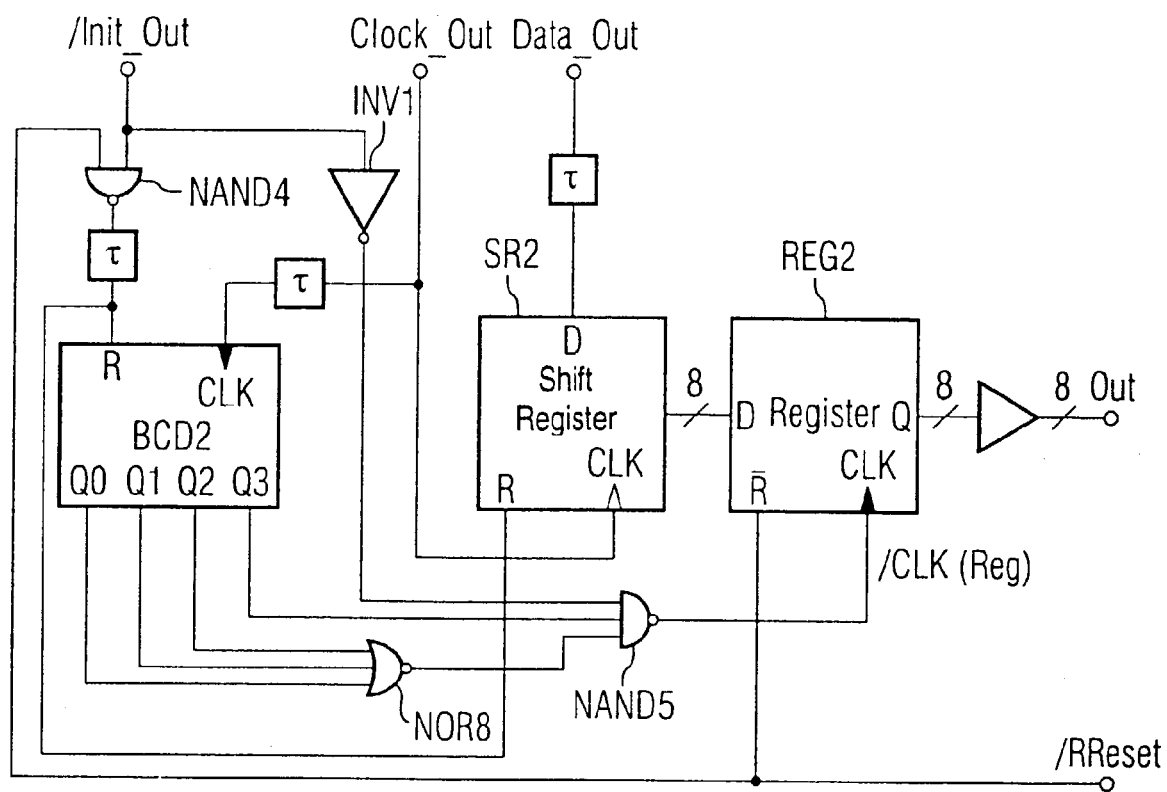
FIG. 9 is a schematic circuit diagram of the receiver-end serial-parallel converter.

An exemplary embodiment of a serial-parallel converter SP as shown in FIG. 3 is shown in FIG. 9. Time profiles for selected signals from the converter shown in FIG. 9 are shown in FIG. 10.

The serial-parallel converter comprises a BCD counter BCD2 which is clocked in line with the clock signal Clock_Out ascertained at the receiver end and whose count increases upon the negative edge of the clock signal Clock_Out. The counter is reset in line with the initialization signal /Init_Out generated at the receiver end or in line with an external reset signal/RReset. These two signals are supplied to a NAND gate NAND4, and, regardless of the external reset signal /RReset, the counter BCD2 is reset whenever the receiver-end initialization signal /Init_Out assumes the value of a logic "0".

The data symbols in the data signal Data_Out at the output are supplied, in time with the clock signal Clock_Out at the output, to a shift register SR2 which is always reset simultaneously with the BCD counter on the basis of the receiver-end initialization signal /Init_Out or the external reset signal /RReset.

The times at which the receiver-end initialization signal /Init_Out assumes the value of a logic "0" and resets the counter BCD2 and the shift register SR2 correspond to the times at which the transmitter-end initialization signal assumes the value of a logic value "1", and thus signal the start of a sequence of data symbols which are read into the shift register SR2 in line with the clock signal Clock_Out. The data provided at the output of the shift register SR2 are transferred to a register REG2, under clock control this register REG2 being clocked on the basis of the count on the counter BCD2 and the initialization signal /Init_Out. The clock signal /CLK(Reg) (shown in FIG. 10) for this register REG2 predominantly assumes the value of a logic "1" and falls to the value of a logic "0" only when the least significant bits Q0, Q1, Q2 of the counter BCD2 are "0", when the most significant bit Q3 of the BCD counter BCD2 is "1" and when the initialization signal /Init_Out assumes the value of a logic "0". For this purpose the least significant bits Q0, Q1 and Q2 are input into a NOR gate NOR8, the output of which is input into a NAND gate NAND5 together with the most significant bit Q3 and the initialization signal /Init out after inversion at INV1. The register REG2 then adopts the data bits from the shift register SR2 upon the falling edge of this clock signal. The clock signal /CLK (Reg) for the register REG2 then assumes the value of a logic "1" again after the counter BCD2 has been reset. The delay time for which this clock signal remains at the level of a logic "0" before the counter BCD2 is reset results from the gate delay times and from the delay time when resetting the counter BCD2.

The apparatuses for carrying out the method according to the invention which have been explained with reference to FIGS. 3 to 10 are to be understood merely by way of example. It will be understood that it is also possible to use any other apparatuses for carrying out the inventive method whose fundamental concept is conversion of a data word into two serial differential data sequences, where one data sequence contains the data bits of the data word in inverted form, and where the data bits or the inverted data bits of the data word in the serial data sequence are respectively limited by initialization bits, and the two data sequences are transmitted via separate channels.

I claim:

1. A method for transmitting a digital data word, which comprises the following method steps, to be performed at a transmitter end:
   converting the data word into a first serial differential data sequence containing at least one initialization bit and data bits of the data word in time with a clock signal;
   converting the data word into a second serial differential data sequence containing at least one initialization bit and data bits of an inverted data word, obtained by inverting the data word, in time with the clock signal;
   transmitting the first serial differential data sequence via a first data channel, and transmitting the second serial differential data sequence via a second data channel.

2. The method according to claim 1, which comprises the following method steps, to be performed at the receiver end:
   ascertaining a clock signal from a first received data sequence, resulting from the first serial differential data sequence transmitted through the first data channel and from a second received data sequence, resulting from the second serial differential data sequence transmitted through the second data channel; and
   ascertaining a data word from the first received data sequence and from the second received data sequence.

3. The method according to claim 1, which comprises:
   adding the at least one initialization bit to the data word to form a long data word, converting the long data word into the first serial differential data sequence; and
   adding the at least one initialization bit to the inverted data word to form a long inverted data word, and converting the long inverted data word into the second serial differential data sequence.

4. The method according to claim 1, which comprises converting the data word into the serial data sequence in synchronicity with the clock signal, forming a serial initialization data sequence containing the at least one initialization bit, and forming the first and second serial differential data sequences from the serial data sequence and from the initialization data sequence.

5. The method according to claim 4, wherein a number of data bits in the serial data sequence corresponds to a number of data bits in the data word plus a number of initialization bits, where at least one of the data bits of the data word occurs repeatedly, and thereby occupying a position of repeated data bits in the serial data sequence by the at least one initialization bit in the first and second serial differential data sequences.

6. An apparatus for transmitting a data word, comprising:
   data input for receiving a data word;
   a clock input for receiving a clock signal;
   a converter unit for converting the data word into a first serial differential data sequence containing at least one initialization bit and data bits of the data word in time with a clock signal, and into a second serial differential data sequence containing at least one initialization bit and data bits of the data word in inverted form in time with the clock signal;
   a first signal output for outputting the first serial differential data sequence; and
   a second signal output for outputting the second serial differential data sequence.

7. The apparatus according to claim 6, which comprises a first converter unit for the first serial differential data sequence and a second converter unit for the second serial differential data sequence;
   said first converter unit comprising a unit for adding at least one initialization bit to the data word and a parallel-serial converter for converting the data word with the initialization bit into the first serial differential data sequence; and
   said second converter unit comprising an inverter for effecting a bit-by-bit inversion of the data word to form an inverted data word, a unit for adding at least one initialization bit to the inverted data word, and a parallel-serial converter for converting the inverted data word with the initialization bit into the second serial differential data sequence.

8. The apparatus according to claim 6, wherein said converter unit comprises:
   a parallel-serial converter unit connected to receive the data word and the clock signal, said parallel-serial converter unit converting the data word into a serial differential data sequence in synchronicity with the clock signal and providing a serial initialization data sequence containing the at least one initialization bit; and
   a coder connected downstream of said parallel-serial converter unit in a signal flow direction, said coder generating the first and second data sequences from the serial differential data sequence and from the initialization data sequence.

9. In an apparatus for acquiring a data word from a received first serial differential data sequence containing information in at least one initialization bit and in data bits of the data word in time with a clock signal and from a received second serial differential data sequence containing information in at least one initialization bit and in data bits of an inverted data word, obtained by inverting the data word, in time with the clock signal, the apparatus comprising:
   a decoder connected to receive the first serial differential data sequence and the second serial differential data sequence, said decoder providing a clock signal, a serial output data sequence, and an initialization data sequence; and
   a serial-parallel converter connected to receive the clock signal, the serial output data sequence and the initialization data sequence, said serial-parallel converter providing an output data word.

10. The apparatus according to claim 9, wherein said decoder is configured to form the serial output data sequence from the first received serial differential data sequence and to form the initialization data sequence and the clock signal from the first received serial differential data sequence and from the second received serial differential data sequence.

11. The apparatus according to claim 9, wherein said decoder is configured to form the initialization data sequence using a NAND function and to form the clock signal using a NOR function from the first received serial differential data sequence and from the second received serial differential data sequence.

* * * * *